(12) United States Patent
Vogt

(10) Patent No.: US 7,702,874 B2
(45) Date of Patent: Apr. 20, 2010

(54) MEMORY DEVICE IDENTIFICATION

(75) Inventor: Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 326 days.

(21) Appl. No.: 11/165,595

(22) Filed: Jun. 22, 2005

(65) Prior Publication Data

US 2006/0294335 A1   Dec. 28, 2006

(51) Int. Cl.
*G06F 12/00* (2006.01)
*G06F 13/00* (2006.01)
*G06F 13/28* (2006.01)

(52) U.S. Cl. .................................................. 711/170
(58) Field of Classification Search ................... 711/170
See application file for complete search history.

(56) References Cited

U.S. PATENT DOCUMENTS

| | | | |
|---|---|---|---|
| 6,167,495 | A | 12/2000 | Keeth et al. |
| 6,839,266 | B1 * | 1/2005 | Garrett et al. .................. 365/69 |
| 7,093,076 | B2 * | 8/2006 | Kyung .......................... 711/133 |
| 2002/0085655 | A1 | 7/2002 | Johnson |
| 2006/0236042 | A1 * | 10/2006 | Jain et al. .................... 711/154 |

OTHER PUBLICATIONS

*Intel 82443GX AGPset Specification Update*, Nov. 2001, pp. 1-17.
Micron Technology, Inc., *Micron Memory Modules for Canterwood and Springdale Chipsets*, pp. 1-2.
Tomdio Nana and Roland Pang, *Texas Instruments Application Report, SCEA031, Application of the SN74SSTVF16857 in Planar PC2700 (DDR-333) RDIMMs*, Jan. 2003, pp. 1-27.
Elpida Memory, Inc., *Preliminary Data Sheet, 2GB Registered DDR SDRAM DIMM*, Nov. 2003, pp. 1-19.
Kingston Technology Company, Inc., *Memory Ranks and Intel E7320/E7520 Chipset-based Servers*, Apr. 28, 2005, 5 pages.
Technology Marketing Corporation (TMC) TMCnet News, *Staktek CSP Stacking Technology for DDR1 and DDR2 SDRAMs in Volume Production*, Apr. 28, 2005, 2 pages.
Sanmina-SCI Corporation, *Viking Interworks Launches Planar 2 Gigabyte DDR2 RDIMM PC2-3200 and PC2-4200, Planar Memory Design Overcomes High Cost of Stacked-die Technology*, Apr. 28, 2005, 1 page.
Thor Sewell, Intel Corporation, *Technology@Intel Magazine, New DDR2 Memory Offers Adavantages for Dual-Processor Servers*, Sep. 2004, pp. 1-7.
International Search Report for corresponding matter P21376PCT dated Jan. 9, 2007.
CN PTO, "First Office Action", Chinese Application No. 200680020620.5, Mailed Oct. 15, 2009, whole document.
EPO, "First Office Action", European Application No. 06773852.6-2210, Issued Apr. 10, 2008, Whole Document.
KR PTO, "Office Action", Korean Patent Application No. 2007-7030496, mailed Oct. 16, 2009, whole document.

* cited by examiner

*Primary Examiner*—Sheng-Jen Tsai
(74) *Attorney, Agent, or Firm*—Blakely, Sokoloff, Taylor & Zafman LLP

(57) ABSTRACT

A memory device may determine its device ID in response to the order of a received training pattern. The training pattern may be transmitted over swizzled signal lines to multiple memory devices arranged in a logical stack. Each memory device may be packaged on a substrate having the swizzled signal lines. The memory devices may be physically stacked or planar. Other embodiments are described and claimed.

17 Claims, 5 Drawing Sheets

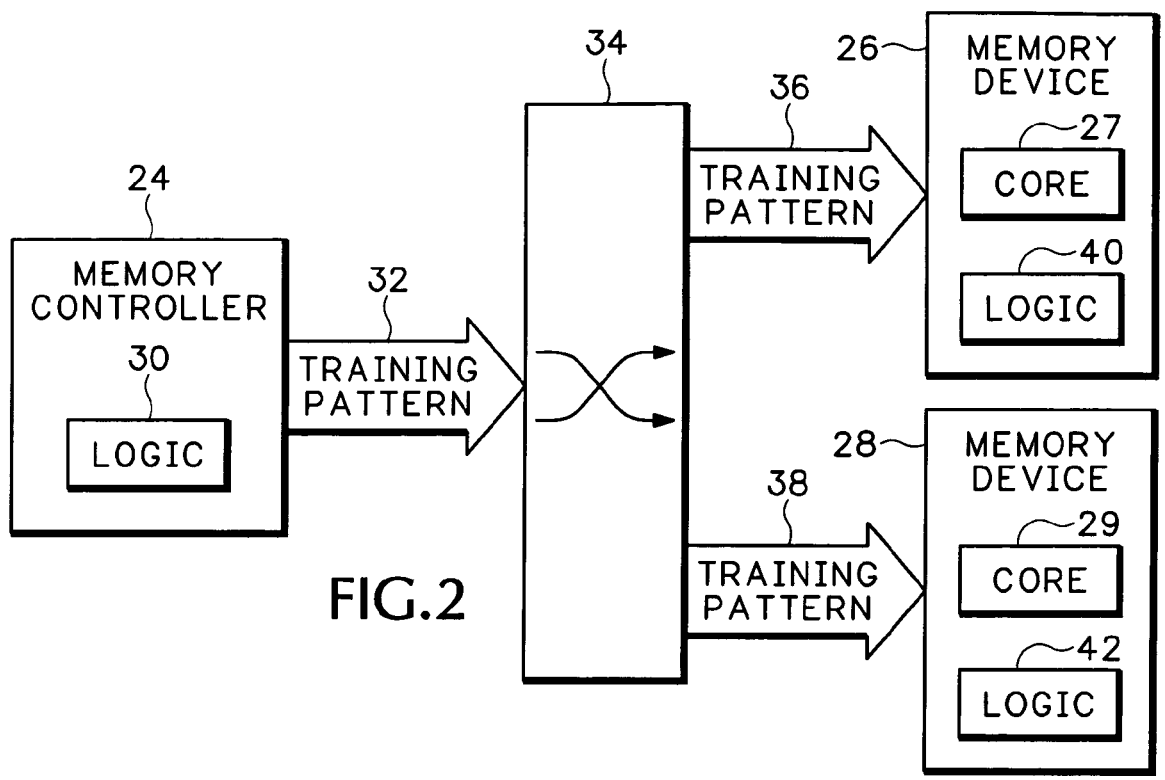
FIG.2
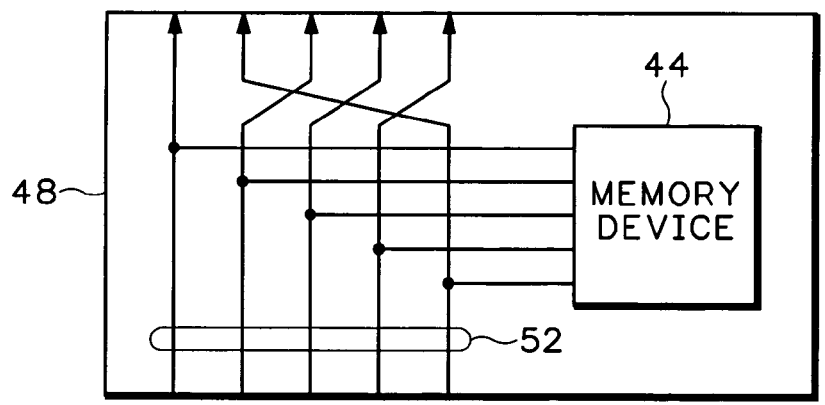
FIG.3
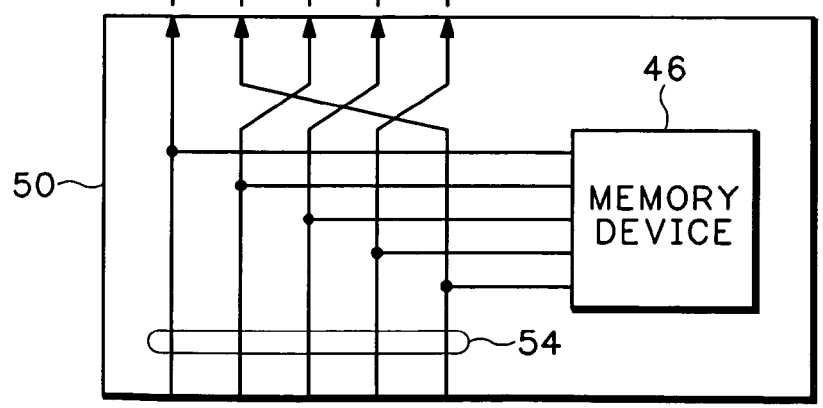

MEMORY DEVICE IDENTIFICATION

BACKGROUND

FIG. 1 illustrates a prior art memory module 10. The module includes memory devices 14 that are mounted on a circuit board 12 and connected to a computer memory system through an interface 18. The module may be, for example, a dual inline memory module (DIMM) in which the memory devices are dynamic random access memory (DRAM) devices mounted on a printed circuit board (PCB) and the interface 18 simply includes two rows of conductive contacts 20 on either side of the PCB to form a card edge connection between the module and a memory controller on a computer mother board.

A signal routing scheme 22 determines how the memory devices communicate with other components in the memory system. For example, memory devices 14 may be connected in a bus arrangement in which an individual signal line is directly connected between a contact 20 and more than one memory device. This may also be referred to as a multi-drop or star arrangement. Memory devices may also be connected in a point-to-point (P2P) arrangement in which an individual signal line only connects a contact with a single memory device. Additional point-to-point signal lines may also be used to connect the memory device to other memory devices. This may also be referred to as a daisy chain arrangement, and if the point-to-point connections allow for a closed loop, it may be referred to as a ring arrangement.

In some memory modules, the interface 18 may include additional functionality. For example, with a registered DIMM (RDIMM), the interface includes registers for the command and address signals, while the data lines are generally connected directly to the channel. In a fully buffered DIMM (FB-DIMM), all signal lines for the memory device, including the data lines, are buffered from the channel.

Memory devices on a module may be arranged in logical stacks 16 in which there is some overlap in the signaling to access different devices in the same stack as shown in FIG. 1. For example, on a dual-rank DIMM, one memory device may be physically stacked on top of another memory device with all terminals on the top device (rank 1) connected directly to the corresponding terminals on the bottom device (rank 0), except the chip select (CS) terminals CS0,CS1 are wired separately so that the ranks can be accessed separately. Memory devices may also be arranged in logical stacks even if the devices are not physically stacked. For example, two memory devices may have all of their corresponding terminals (except for the CS terminals) connected together through PCB traces even though both memory devices are mounted directly to the board. This may be referred to as a planar design even though the PCB may be flexible and not strictly planar, or the memory devices may be mounted on opposite sides of the board.

BRIEF DESCRIPTION OF THE DRAWINGS

FIG. 2 illustrates an embodiment of a memory system according to the inventive principles of this patent disclosure.
FIG. 3 illustrates an embodiment of memory components according to the inventive principles of this patent disclosure.

DETAILED DESCRIPTION

Figure 1:
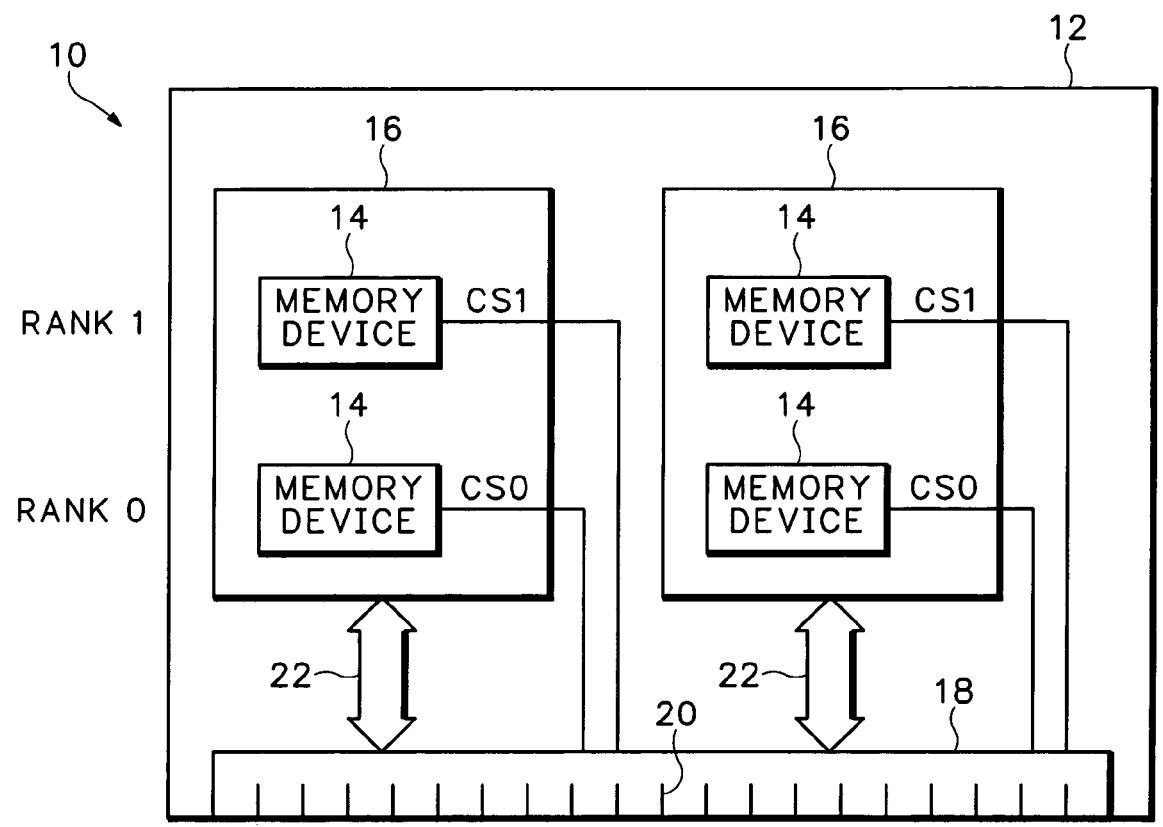
FIG. 1 illustrates a prior art memory module

This patent disclosure encompasses multiple inventive principles that have independent utility. In some cases, additional benefits may be realized when some of the principles are utilized in various combinations with one another, thus giving rise to additional inventions. These principles may be realized in countless embodiments. Although some specific details are shown for purposes of illustrating the inventive principles, many other arrangements may be devised in accordance with the inventive principles of this patent disclosure. Thus, the inventive principles are not limited to the specific details disclosed herein.

FIG. 2 illustrates an embodiment of a memory system according to the inventive principles of this patent disclosure. The system of FIG. 2 includes a memory controller 24 and two logically stacked memory devices 26 and 28. The memory controller includes logic 30 to transmit a training pattern 32 to the memory devices. Logic 34 changes the order in which the signals in the training pattern are received at each memory device. Logic 40 and 42 associated with memory devices 26 and 28, respectively, enables each memory device to determine its device identification (device ID) by observing the order in which the training pattern is received. The training pattern may be transmitted by the memory controller, for example, during an initialization procedure. Once each memory device has determined its device ID, the memory controller may access each device individually by including a device ID in any further commands it issues to the memory devices. Although the embodiment of FIG. 2 is illustrated with two memory devices, the inventive principles may be extended to any number of devices arranged in different logical configurations.

FIG. 3 illustrates an embodiment of memory components according to the inventive principles of this patent disclosure. The embodiment of FIG. 3 includes two memory devices 44 and 46 mounted on substrates 48 and 50, respectively. Signal lines 52 on substrate 48 are swizzled so that signals are reordered as they traverse the signal lines. Signal lines 54 on the other substrate 50 may be swizzled in the same manner as signal lines 52. The signal lines are also connected to the respective memory devices on each substrate.

The components of FIG. 3 may be arranged to implement device identification without the need for chip select signals according to the inventive principles of this patent disclosure. For example, memory devices 44 and 46 may be arranged in a logical stack with signal lines 52 and 54 connected together in a point-to-point arrangement as shown by the broken lines in FIG. 3. Command/address/write (CA) signals from a memory controller may be applied to signal lines 54. The CA signals are received by the first memory device 46 in their original order, but swizzling on lines 54 rearranges the order in which the signals are received by the second memory device 44. By sending an appropriate training pattern on the CA signals, logic in each memory device may determine its device ID. Additional memory device/substrate assemblies may be logically stacked so that the swizzling on signal lines 52 further reorders the CA signals to a third memory device, and so on.

The memory devices may further include deswizzle logic to rearrange the CA signals to their original patterns once the device ID has been determined. Read (RD) signals may be returned from the memory devices by any appropriate technique. For example, read data may be returned from the memory devices to the memory controller through separate signal lines that may be configured in a multi-drop arrangement, point-to-point arrangement, a ring configuration, etc.

Figure 4:
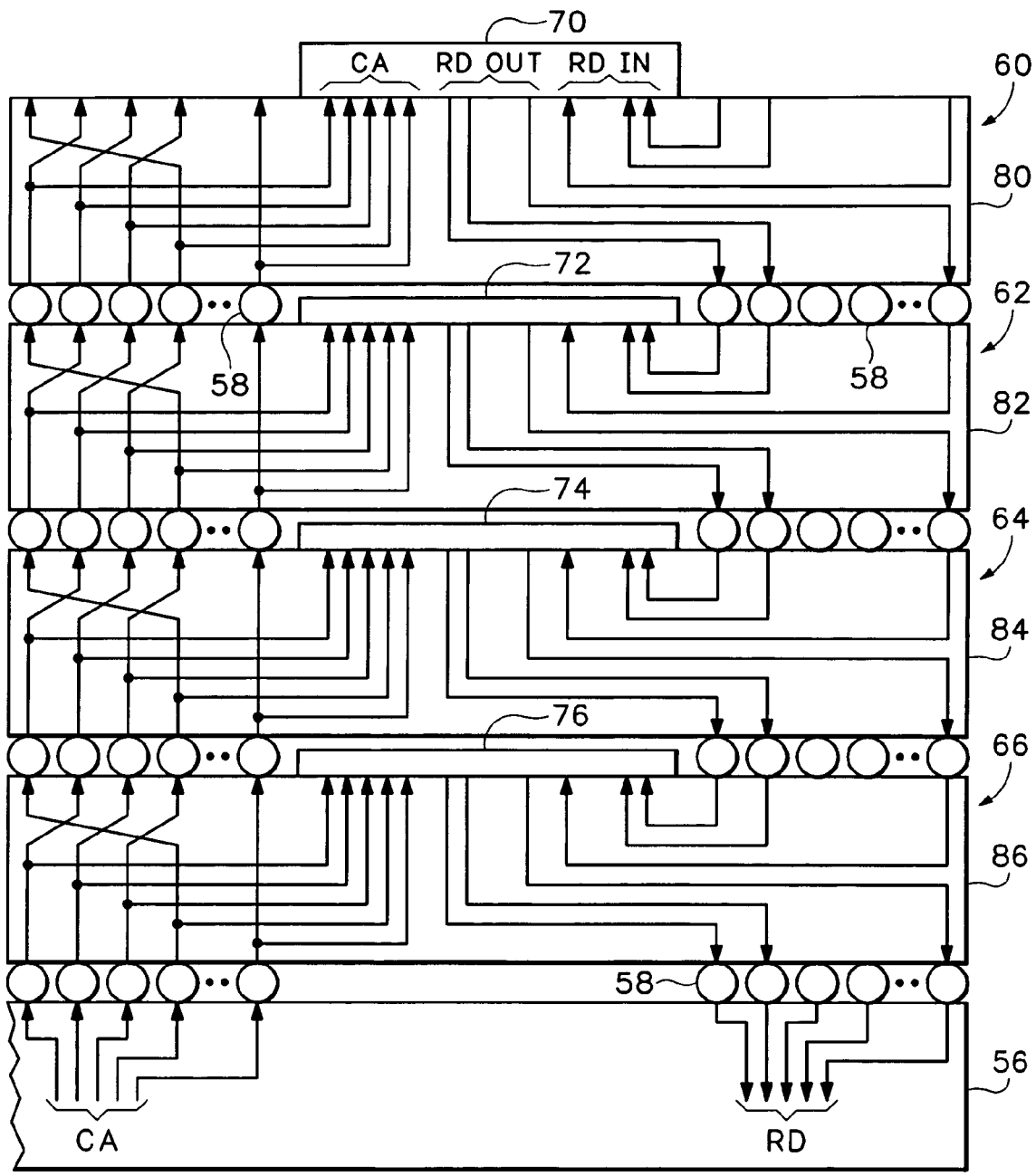
FIG. 4 illustrates an embodiment of a memory module according to the inventive principles of this patent disclosure.

FIG. 4 illustrates an embodiment of a memory module according to the inventive principles of this patent disclosure. FIG. 4 is a side view showing how four memory devices may be both logically and physically stacked to create a four-rank, high density memory module. Four memory device packages 60, 62, 64 and 66 are mechanically and electrically connected to each other and the module printed circuit board 56 through solder ball connections 58. Package 60 includes a memory device 70 mounted on a substrate 80. Packages 62-66 include memory devices 72-76 mounted on substrates 82-86, respectively. The substrates may be fabricated from any suitable material, e.g., fiberglass PCB material with etched conductive traces for routing signals and making solder connections. In the embodiment of FIG. 4, the CA signals are routed in a star configuration, while the RD signals are returned in a chain configuration, but other configurations may be used. The CA lines on each substrate are swizzled so that each memory device sees the CA signals in a different order, thereby allowing each memory device to determine its rank within the stack in response to a training sequence transmitted on the CA lines. Only one stack is shown in FIG. 4, but any number of stacks and ranks may be implemented according to the inventive principles of this patent disclosure.

Figure 5:
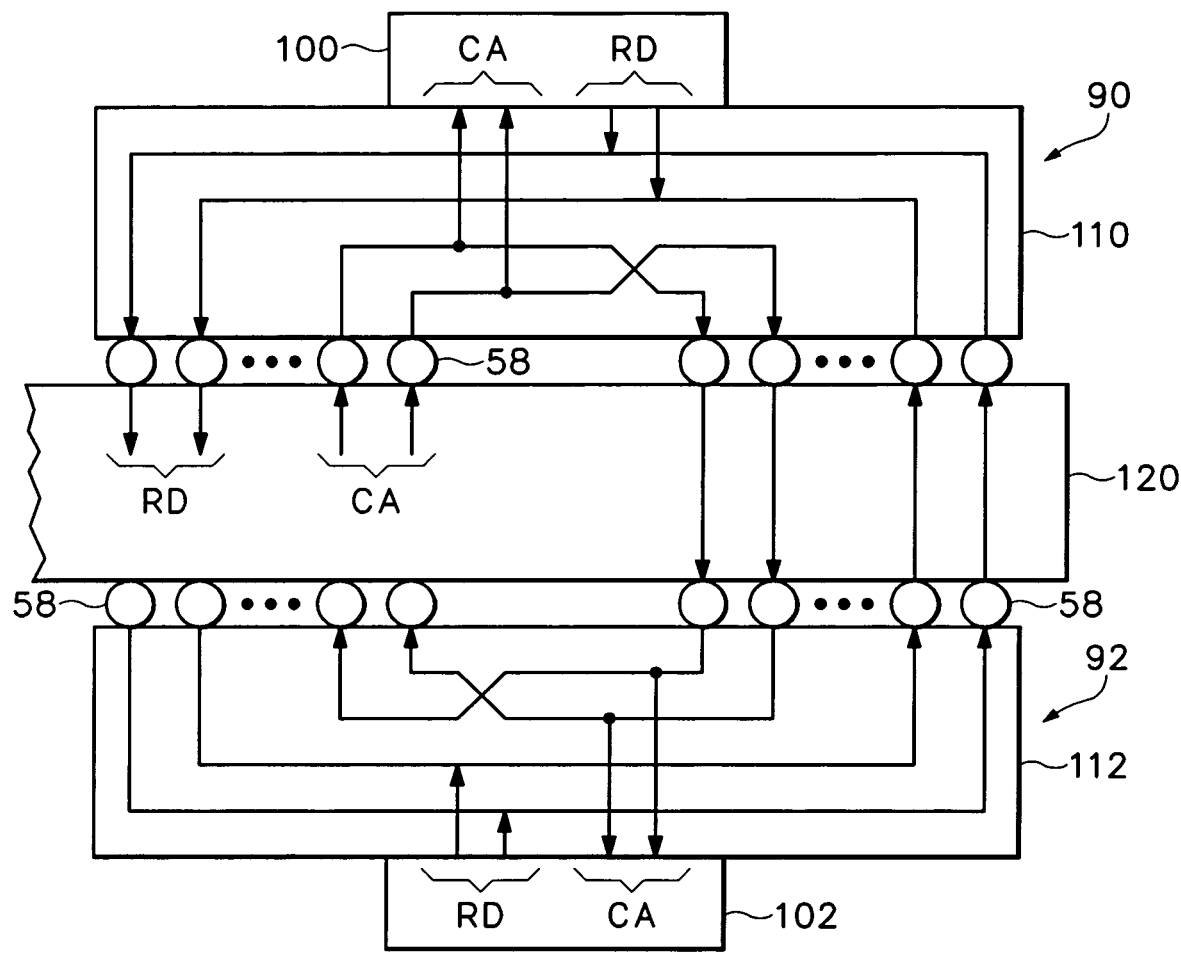
FIG. 5 illustrates another embodiment of a memory module according to the inventive principles of this patent disclosure.

FIG. 5 is a side view of an embodiment of a memory module showing how memory devices may be logically stacked but physically planar according to the inventive principles of this patent disclosure. The embodiment of FIG. 5 is a two-rank module with memory device packages 100 and 102 mounted on opposite sides of a PCB 120 through solder ball connections 58. The CA signals are routed in a star configuration, but in this embodiment, the RD signals are also returned in star configuration. CA lines on each substrate are swizzled so that each memory device sees the CA signals in a different order, thereby allowing each memory device to determine its rank within the stack in response to a training sequence transmitted on the CA lines. As with the embodiment of FIG. 4, many variations are possible with the embodiment FIG. 5. For example, the RD signals may be returned in a chain or ring configuration, the memory devices may be mounted on the same side of the board, any number of stacks and ranks may be implemented, etc.

Figure 6:
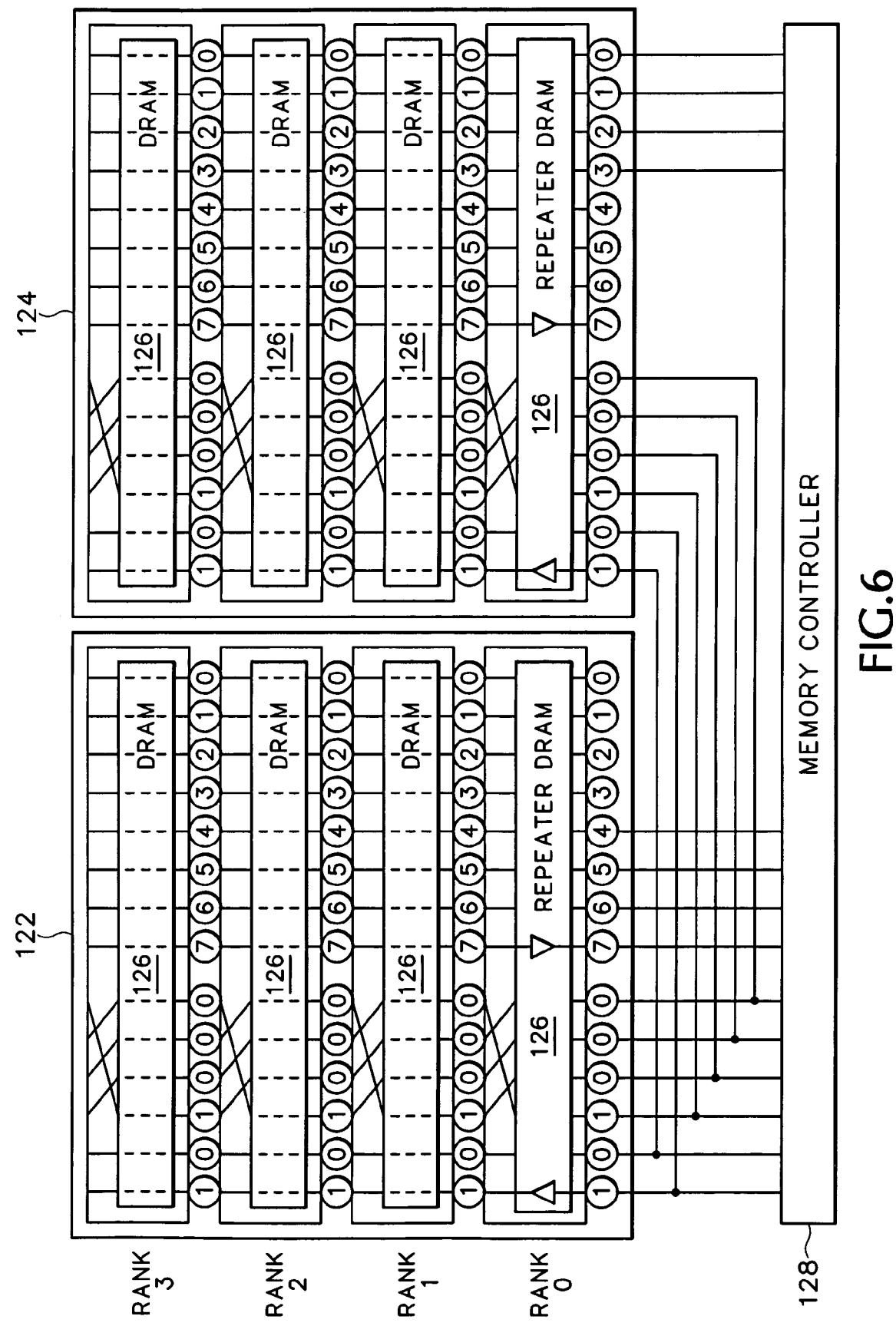
FIG. 6 illustrates another embodiment of a memory system according to the inventive principles of this patent disclosure.

FIG. 6 schematically illustrates another embodiment of a memory system according to the inventive principles of this patent disclosure. In the embodiment of FIG. 6, two stacks 122, 124 of memory devices 126 are arranged so that each stack receives all of the write data but stores only half of the data. The two left CA lines may be swizzled to each stack to tell each stack which half of the data to write. During a read operation, the memory devices in each stack drives its half of the data onto the RD lines. Swizzling on the CA lines enables each memory device to determine its rank within its stack in response to a training sequence transmitted on the CA lines by the memory controller 128. The lowest logical (rank 0) memory device on each stack may be implemented as a repeater device to redrive signals to and from the other memory devices in the stack.

Alternatively, the stacks may be reconfigurable for variable path size operation. That is, in one configuration, each memory device may operate in x4 (half data) mode as shown in FIG. 6, or in x8 mode in which each memory device operates with a full 8-bit path. To enable reconfigurable and/or split path operation, a common mechanism may be used to allow each memory device to determine its device ID, select the path width, and/or select which portion of a split path a particular memory device is associated with. For example, during an initialization procedure, the training pattern sent by the memory controller may include not only pattern for determining device ID, but also information that tells each memory device whether it is operating on a full or split path, and if a split path, which portion of the split path it is associated with, i.e., whether it is on the upper or lower 4 bit portion in the embodiment of FIG. 6. Logic within the memory devices may decode the additional information and configure the device accordingly.

Figure 7:
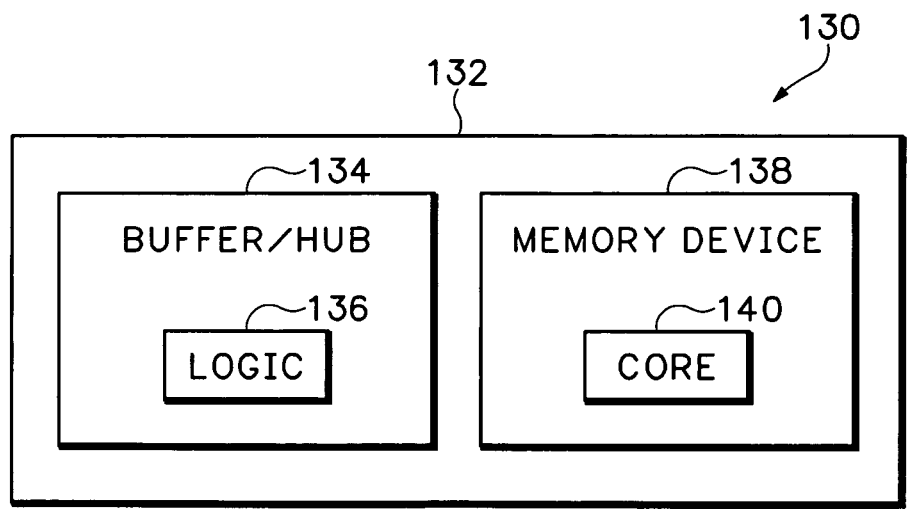
FIG. 7 illustrates another embodiment of a memory module according to the inventive principles of this patent disclosure.

FIG. 7 illustrates another embodiment of a memory module according to the inventive principles of this patent disclosure. The memory module 130 includes a memory buffer 134, and one or more memory devices 138 mounted on a substrate 132. In this embodiment, logic 136 to determine a memory device ID is located in the buffer. The memory buffer may be a conventional memory buffer, or it may be implemented as a memory hub, which may include much of the same functionality as a memory buffer, but may also include additional functionality such as a controller for memory devices, e.g., a DRAM controller.

The embodiments described herein may be modified in arrangement and detail without departing from the inventive principles. For example, modules, package substrates, and mother boards are generally described above as separate apparatus, but all or some of the memory devices, logic, memory controllers, etc. may be fabricated on a single board, or in any convenient combination of boards. Some embodiments have been described with specific numbers of ranks and/or stacks, but the inventive principles are not limited to any specific numbers. Logic may be implemented as specific circuitry or conductors, but it may also be implemented using software, state machines, etc. Some connections have been shown using solder ball techniques, but the inventive principles are not limited to any particular connection scheme. Likewise the inventive principles are not limited to memory systems having unregistered, unbuffered, registered or fully buffered memory modules or devices. Accordingly, such changes and modifications are considered to fall within the scope of the following claims.

The invention claimed is:

1. Memory apparatus comprising:
   a first memory device, including a first memory core, to receive a training pattern during an initialization procedure, the training pattern to be received in a first order;
   a first logic to determine the first memory core's identification based, at least in part, on the first order of the received training pattern; and
   a substrate attached to the first memory device, wherein, the substrate includes a plurality of swizzled command/address signal lines to change the received training pattern from the first order to a second order, the plurality of command/address signal lines coupled with a second memory device in a multi-drop topology, the second memory device to
   receive the training pattern in the second order, and
   determine a second memory core's identification based, at least in part, on the second order of the received training pattern, the second memory core included in the second memory device.

2. The memory apparatus of claim 1 where the memory apparatus further comprises a memory buffer including the first logic.

3. The memory apparatus of claim 1 further comprising logic to decode path width information.

4. The memory apparatus of claim 1 further comprising logic to decode path portion information.

5. The memory apparatus of claim 1
logic to determine the second memory device's identification in response to an order wherein the apparatus further includes the second memory device.

6. The memory apparatus of claim 5, wherein the second memory device includes swizzled signal lines to change the order of the training pattern from the second order to a third order.

7. The memory apparatus of claim 5 where the first and second memory devices are logically stacked.

8. The memory apparatus of claim 1 further comprising logic to deswizzle signals received on the swizzled signal lines.

9. A system comprising:
a first memory device to receive a training pattern during an initialization procedure in a first order, the first memory device having
a first memory core, and
a first logic to determine the identification of the first memory core based, at least in part, on the first order of the received training pattern;
a first substrate attached to the first memory device, wherein the first substrate includes swizzled command/address signal lines to change an order of the received training pattern to a second order different than the first order;
a second memory device logically stacked with the first memory device to receive the training pattern during the initialization procedure in the second order, the swizzled command/address signal lines coupled with the first memory device and the second memory device in a multi-drop topology, the second memory device having
a second memory core, and
a second logic to determine the identification of the second memory core based, at least in part, on the second order of the received training pattern; and
a memory controller coupled to the first and second memory devices to transmit the training pattern to the first and second memory devices.

10. The system of claim 9 where the first and second memory devices are physically stacked.

11. The system of claim 9 where the first and second memory devices are physically planar.

12. The system of claim 9 further comprising read signal lines coupled to the first and second memory devices in a chain configuration.

13. The system of claim 9 further comprising read signal lines coupled to the first and second memory devices in a ring configuration.

14. The system of claim 9 wherein the first memory device comprises logic to redrive signal to and/or from the second memory device.

15. The system of claim 9 where the first and second memory devices and the first and second substrates are substantially identical.

16. The system of claim 9 where the first and second memory devices are mounted on a circuit board.

17. The system of claim 9, further comprising:
a second substrate attached to the second memory device, wherein the second substrate includes swizzled command/address signal lines to change the order of the received training pattern to a third order different than the second order.

* * * * *

UNITED STATES PATENT AND TRADEMARK OFFICE
CERTIFICATE OF CORRECTION

PATENT NO. : 7,702,874 B2  Page 1 of 1
APPLICATION NO. : 11/165595
DATED : April 20, 2010
INVENTOR(S) : Vogt It is certified that error appears in the above-identified patent and that said Letters Patent is hereby corrected as shown below:

In column 5, at line 6 delete, "logic to determine the second memory device's identification in response to an order"

Signed and Sealed this
Fifth Day of April, 2011

David J. Kappos
*Director of the United States Patent and Trademark Office*